(12) United States Patent
Chen et al.

(10) Patent No.: US 8,018,000 B2
(45) Date of Patent: Sep. 13, 2011

(54) ELECTROSTATIC DISCHARGE PROTECTION PATTERN FOR HIGH VOLTAGE APPLICATIONS

(75) Inventors: Shui-Hung Chen, Hsinchu (TW); Jian-Hsing Lee, Hsin-Chu (TW); Yung-Tien Tsai, Hsin-Chu (TW); Anthony Oates, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 693 days.

(21) Appl. No.: 12/046,216

(22) Filed: Mar. 11, 2008

(65) Prior Publication Data

US 2009/0179270 A1 Jul. 16, 2009

Related U.S. Application Data

(60) Provisional application No. 61/020,620, filed on Jan. 11, 2008.

(51) Int. Cl.
*H01L 23/62* (2006.01)
(52) U.S. Cl. ................... 257/355; 257/E27.033
(58) Field of Classification Search .................. 257/355, 257/377, 382, 384, 401, E21.62, E29.122, 257/E29.12, E29.116
See application file for complete search history.

(56) References Cited

U.S. PATENT DOCUMENTS

| 5,623,387 | A | 4/1997 | Li et al. | |
|---|---|---|---|---|
| 6,747,321 | B2 * | 6/2004 | Kanamori | 257/382 |
| 2005/0167739 | A1 * | 8/2005 | Kogami et al. | 257/327 |
| 2006/0017070 | A1 * | 1/2006 | Ikoma et al. | 257/213 |

* cited by examiner

*Primary Examiner* — Evan Pert
*Assistant Examiner* — Selim Ahmed
(74) *Attorney, Agent, or Firm* — Slater & Matsil, L.L.P.

(57) ABSTRACT

Electrostatic discharge (ESD) protection in high voltage semiconductor devices is disclosed that provides enhanced current isolation between transistor drains or sources by creating an isolation island surrounding the drains or sources. This isolation island can be a higher-doped region within which the drain/source lies. The junction between the higher doping of this island region and the surrounding substrates operates to limit the amount of current that passes through the drain/source. Additionally, oxide features may be used to create an island surrounding the drain/source contact. Again, this isolating effect makes the amount of current passing through the device more uniform, which protects the device from damage due to an ESD event.

15 Claims, 12 Drawing Sheets

ELECTROSTATIC DISCHARGE PROTECTION PATTERN FOR HIGH VOLTAGE APPLICATIONS

This application claims priority to U.S. Provisional Patent Application Ser. No. 61/020,620, filed Jan. 11, 2008, entitled "Electrostatic Discharge Protection Pattern for High Voltage Applications," which application is hereby incorporated herein by reference.

TECHNICAL FIELD

The present invention relates, in general, to semiconductor device technology, and, more particularly, to an electrostatic discharge (ESD) protection pattern for high voltage applications.

BACKGROUND

Computer microchips permeate almost all aspects of modern life. From the single microchips embedded into our pets to the myriad of microchips "flying" our aircraft and keeping our cars running, our reliance on semiconductor device technology cannot be minimized. A topic of great importance, considering all of the critical operations controlled by semiconductor devices, is the durability and reliability of those devices. One issue that has been at the forefront of semiconductor device design is protecting devices from electrostatic discharge (ESD). ESD is defined as the transfer of charge between bodies at different electrical potentials. ESD is a serious issue in solid state electronics. Integrated circuits are made from semiconductor materials such as silicon and insulating materials such as silicon dioxide. When subjected to high voltages, many semiconductor materials can suffer permanent damage, changing the electrical characteristics, degrading, or destroying it. It may also upset the normal operation of an electronic system, causing equipment malfunction or failure.

Damage to electronic devices from ESD can occur at any point from manufacture to field service. Damage may result from improperly handling the devices in uncontrolled surroundings or when substandard ESD control practices are used. Generally, ESD damage is classified as either a catastrophic failure or a latent defect.

A catastrophic failure occurs when an electronic device no longer functions after exposure to an ESD event. An ESD event may cause a metal melt, junction breakdown, or even oxide failure. A device's circuitry can, therefore, be permanently damaged causing the device to fail. Such failures can usually be detected when a device is tested before shipment. However, if the ESD event occurs after testing, the damage may go undetected until the device fails in operation.

A latent defect, on the other hand, is typically more difficult to identify. A device that is exposed to an ESD event may be partially degraded, yet continue to perform its intended function. However, this degradation generally reduces the operating life of the device dramatically. A product or system that incorporates a device with latent defects may experience premature failure after the user places the device into service. Such failures are usually costly to repair and in some applications may create personnel hazards.

Various external solutions and procedures have been developed for preventing ESD damage during fabrication and device manufacturing. Manufacturers often implement electrostatic protective areas (EPAs). An EPA can be a small working station or a large manufacturing area. The main principles of an EPA are: (1) there are no highly charging materials in the vicinity of ESD sensitive electronics; (2) all conductive materials are grounded; and (3) workers are grounded. Adherence to these principles may prevent charge build-up on ESD sensitive electronics. International standards are used to define typical EPA and can be found, for example, from International Electrotechnical Commission (IEC) or American National Standards Institute (ANSI).

ESD prevention within an EPA may include: using appropriate ESD-safe packing material, using conductive filaments on garments worn by assembly workers, using conducting wrist straps and foot-straps to prevent high voltages from accumulating on workers' bodies, using anti-static mats or conductive flooring materials to conduct harmful electric charges away from the work area, and using humidity control. Humid conditions prevent electrostatic charge generation because the thin layer of moisture that accumulates on most surfaces serves to dissipate electric charges. Ion generators are also sometimes used to inject ions into the ambient airstream. Ionization systems help to neutralize charged surface regions on insulating or dielectric materials.

In addition to such external ESD prevention mechanisms, chip designers have also incorporated ESD protection internally into the design of the device. Various methods and configurations for adding N+ or P+ doped regions have been implemented in field effect transistor (FET) devices in association with source/drain (S/D) and gate regions. One common method is to provide a zero-space N+ S/D implant region between contacts.

A disadvantage of the zero-space N+ S/D implant region and similar configurations is that they do not typically provide good and qualified ESD protection for high voltage applications.

SUMMARY OF THE INVENTION

These and other problems are generally solved or circumvented, and technical advantages are generally achieved, by preferred embodiments of the present invention which enhances ESD protection in high voltage applications using a pattern of separated N+ S/D island implants.

Representative embodiments of the present invention are directed to semiconductor devices that include a gate region and a corresponding plurality of first and second source/drain contacts, each of which together form a plurality of transistors. The semiconductor device also has a plurality of carrier-doped implant regions, where each of these carrier-doped implant regions surrounds a corresponding one of the first source/drain contacts. There is also a plurality of isolation regions between each successive one of the carrier-doped implant regions.

Additional representative embodiments of the present invention are directed to methods for manufacturing high voltage semiconductor devices. The methods include forming a gate structure on a semiconductor substrate, forming a plurality of first and second source/drain regions on the semiconductor substrate each of which together form a plurality of transistors, implanting a first carrier type surrounding the first source/drain regions. Implanting oxide around the first source/drain regions, such that the oxide creates doping of a first carrier type in islands surround the first source/drain regions. Each of these island regions is also isolated from an adjacent island region and the gate contacts by the surrounding oxide. A plurality of contacts is also formed within each of the island regions.

Additional representative embodiments of the present invention are directed to semiconductor devices that are made up from a plurality of transistors on a substrate. The plurality of transistors is made up from a common gate region that provides a gate terminal and contact for each of the plurality of transistors. The transistors also include a plurality of source terminals associated with the common gate region, each source terminal having a source contact and providing an individual source terminal for the plurality of transistors. The transistors also include a plurality of drain terminals associated with the common gate region and each having a drain contact, where each of the plurality of drain terminals corresponds to a corresponding one of the plurality of source terminals. The semiconductor devices also including a plurality of isolation regions surrounding each of the plurality of drain terminals.

Additional representative embodiments of the present invention are directed to methods for manufacturing a semiconductor device that includes forming a common gate region along a substrate, the common gate region having an electrical contact, forming a common source region along a first side of the common gate region in the substrate, forming a plurality of drain terminals along a second side of the common gate region in the substrate, wherein each of the plurality of drain terminals is surrounded by an isolation region isolating the each of the plurality of drain terminals from another of the plurality of drain terminals, constructing a plurality of drain contacts on each of the plurality of drain terminals, and creating a plurality of source contacts on the common source region, wherein the relative orientation of each of the plurality of drain terminals, the common gate region, and portions of the common source regions corresponding to each of the plurality of source contacts makes up a plurality of transistors on the substrate.

Further representative embodiments of the present invention are directed to semiconductor components made up from a plurality of semiconductor devices on a substrate. The plurality of semiconductor devices include a plurality of transistors, which are formed by at least one common gate region across a portion of the substrate, the at least one common gate region having a gate electrical contact, a plurality of first S/D terminals associated with the at least one common gate region, each of the plurality of first S/D terminals having a first terminal electrical contact, a plurality of second S/D terminals associated with corresponding ones of the plurality of first S/D terminals, each of the plurality of second S/D terminals having a second terminal electrical contact, wherein the plurality of second S/D terminals, the corresponding ones of the plurality of first S/D terminals, and the at least one common gate region make up the plurality of transistors. The transistors also include a plurality of terminal isolation regions located around each of the plurality of second S/D terminals. The semiconductor devices further include a plurality of device isolation regions located around each of the plurality of semiconductor devices on the substrate.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
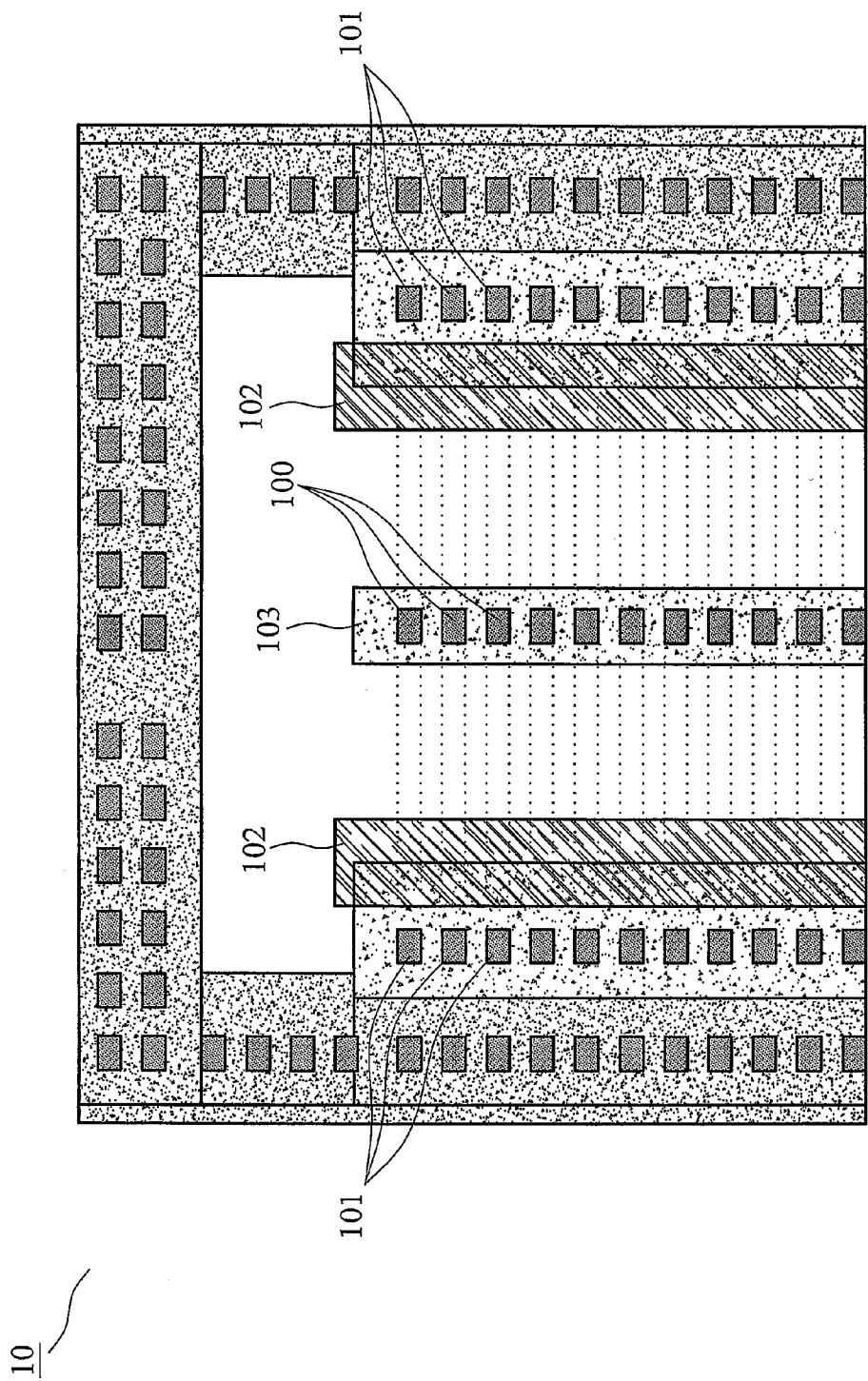
FIG. 1 is a planar view of a transistor group with a zero-space N+ S/D implant region.

Referring now to FIG. 1, a planar view is shown illustrating transistor group 10 having zero-space N+ doped S/D region 103. Transistor group 10 includes S/D contacts 100 and 101, and gate 102. ESD protection is applied to transistor group 10 by having N+ doped region 103 at S/D contacts 100. While zero-spaced N+ doped region 103 reduces the breakdown that occurs during high voltage operation, lateral and other breakdown current leakage associated with ESD continues to be experienced in transistor group 10.

Figure 2:
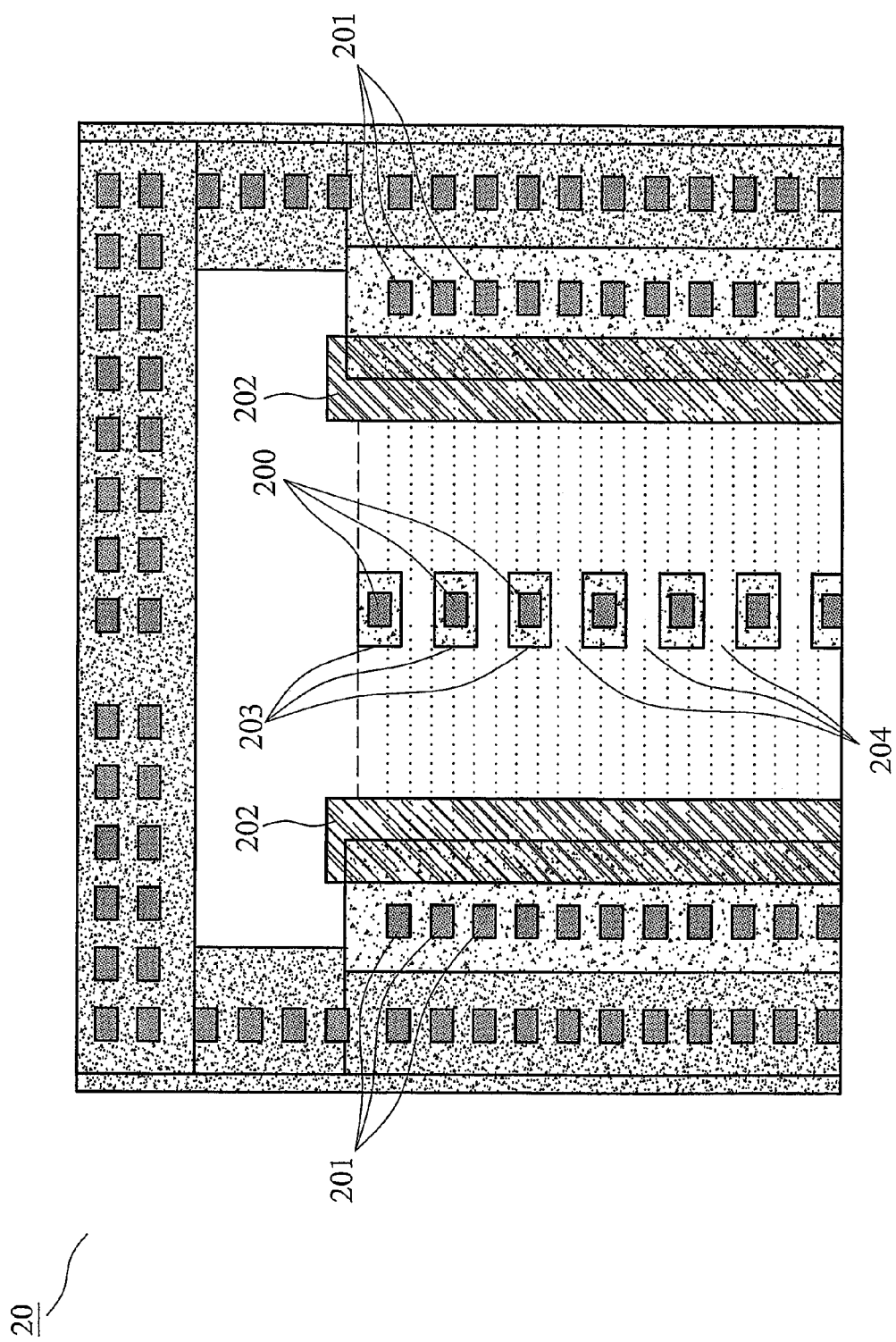
FIG. 2 is a planar view of a transistor group configured according to one embodiment of the present invention.

FIG. 2 is a planar view illustrating transistor group 20 configured according to one embodiment of the present invention. Transistor group 20 includes S/D contacts 200 (Drain) and 201 (Source) and gate 202, similar to transistor group 10 (FIG. 1). However, instead of a continuous doped region, transistor group 20 provides individual carrier doped islands, such as N+ doped island 203 at each of S/D contacts 200. Space 204 provides isolation between each of S/D contacts 200 and their respective N+ doped islands 203. In high voltage uses, this isolation greatly reduces the amount of current leakage within transistor group 20.

The junction between the N+ doping of N+ doped islands 203 and the lighter doping of the surrounding substrate provides a higher barrier to current that the continuous N+ doping of the current methods. By thus limiting the current through S/D contacts 200 with N+ doped islands 203, the current that passes through S/D contacts 200 is much more uniform. This uniformity prevents the passing of the very high current that would normally be present during an ESD event. Moreover, because the current that passes through S/D contacts 201 is related to the current that passes through S/D contacts 200, this limiting protects the transistors from being destroyed by the excessive current that typically accompanies ESD event.

It should be noted that the various embodiments of the present invention may use different substrate or semiconductor materials, such as silicon, gallium arsenide, germanium, and the like. The embodiments of the present invention are not limited to any particular type of semiconductor material.

Figure 3:
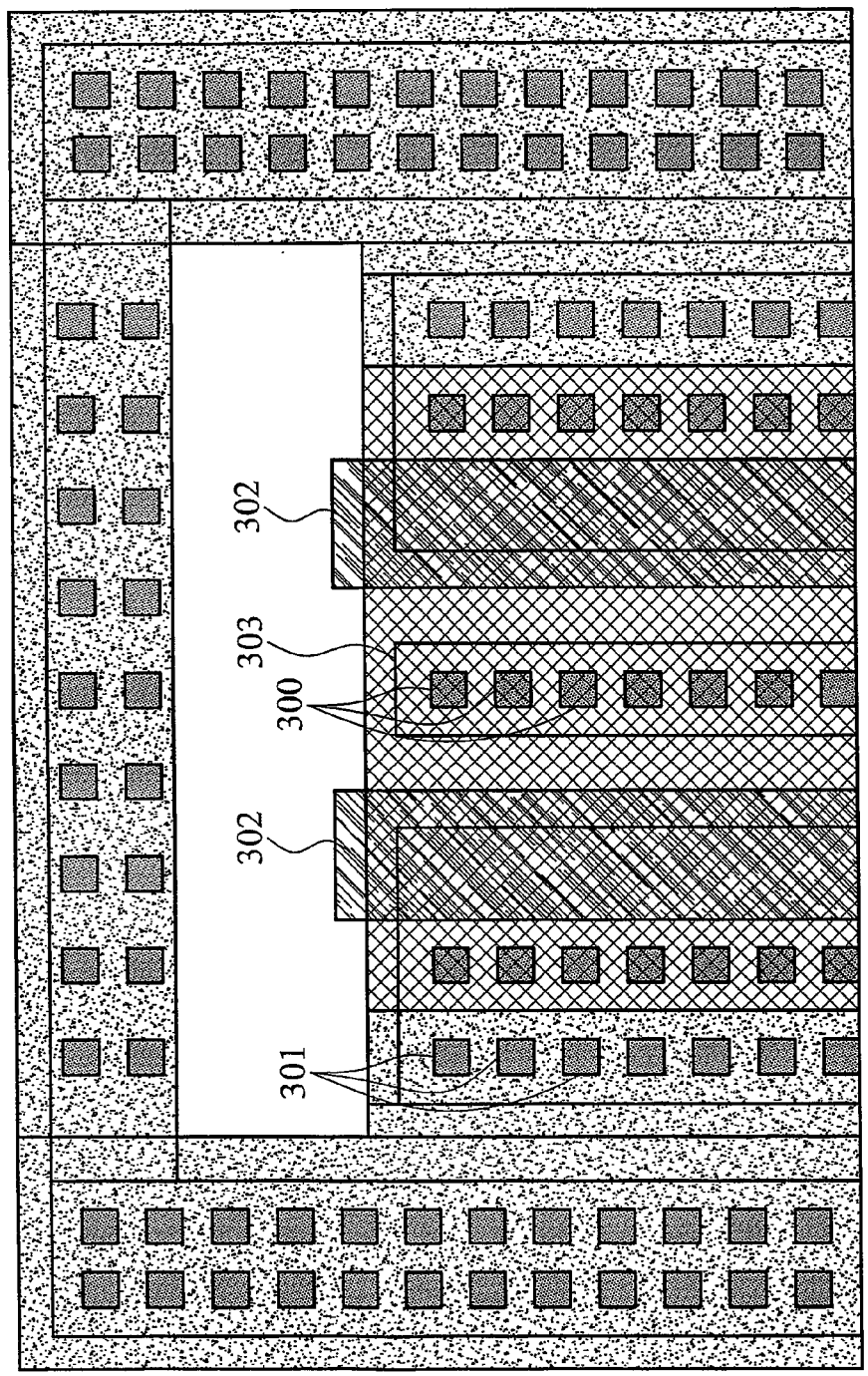
FIG. 3 is a planar view of another example transistor group with a zero-space N+ S/D implant region.

FIG. 3 is a planar view illustrating transistor group 30 having zero-space N+ doped S/D region 303. Transistor group 30 includes S/D contacts 300 and 301, and polysilicon (poly) gate 302. ESD protection is applied to transistor group 30 by having N+ doped region 303 at S/D contacts 300. While zero-spaced N+ doped region 303 reduces the breakdown that occurs during high voltage operation, lateral and other breakdown current leakage associated with ESD continues to be experienced in transistor group 30.

Figure 4:
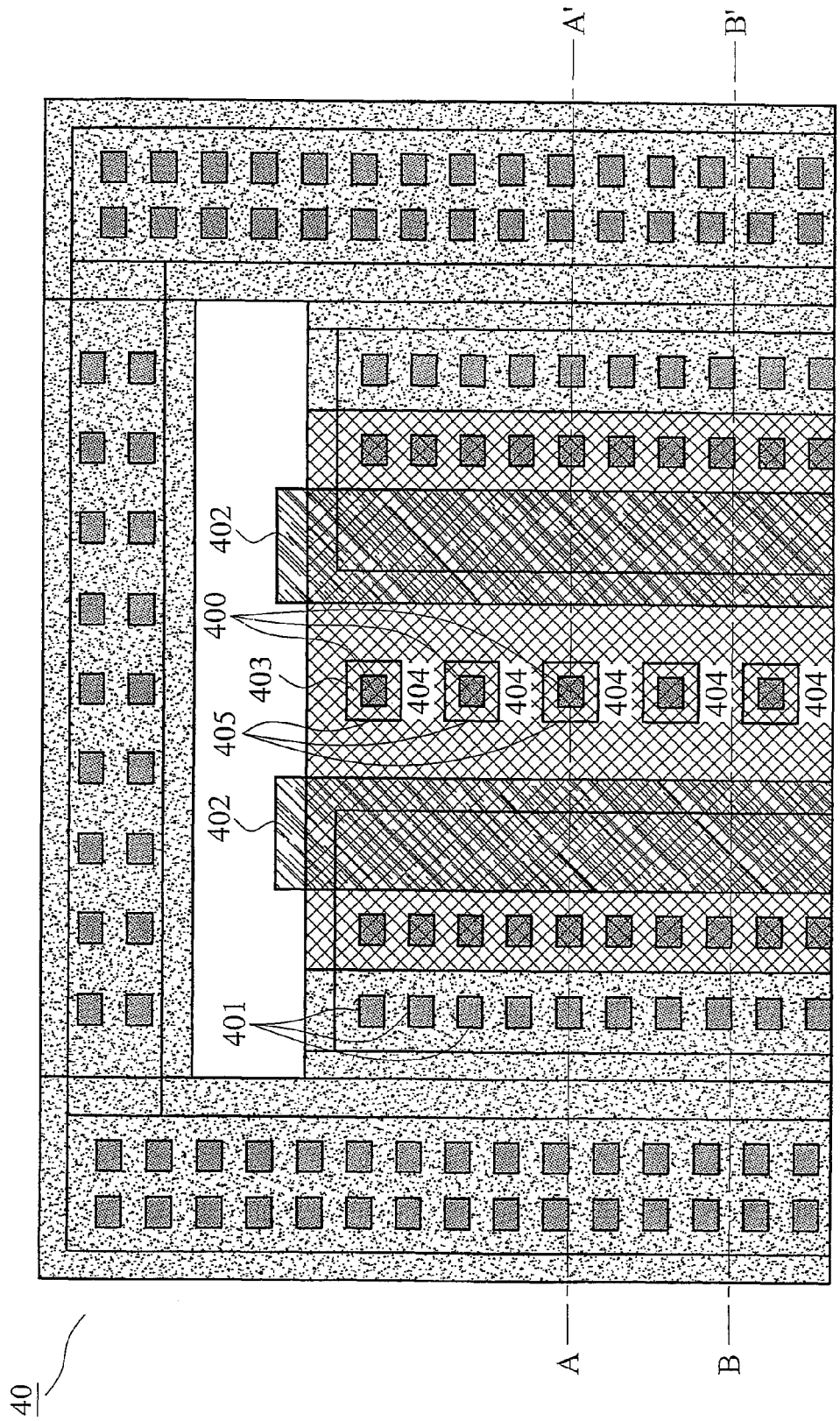
FIG. 4 is a planar view of a transistor group configured according to another embodiment of the present invention.

FIG. 4 is a planar view illustrating transistor group 40 configured according to one embodiment of the present invention. Transistor group 40 includes S/D contacts 400 (Drain) and 401 (Source) and poly gate 402, similar to transistor group 30 (FIG. 3). However, instead of a continuous doped region, transistor group 40 provides N+ doped islands 403 created by individual free oxide implants or features, such as free oxide 405 surrounding each of S/D contacts 400. Spaces 404 and the addition isolating characteristics of free oxide 405 provide isolation between each of S/D contacts 400 and poly gate 402. In high voltage uses, this isolation greatly reduces the amount of current leakage within transistor group 40.

It should be noted that the various embodiments of the present invention may use different and various types of oxides, such as silicon dioxide, silicon nitride, and the like. The embodiments of the present invention are not limited to any particular type of oxide.

Figure 5A:
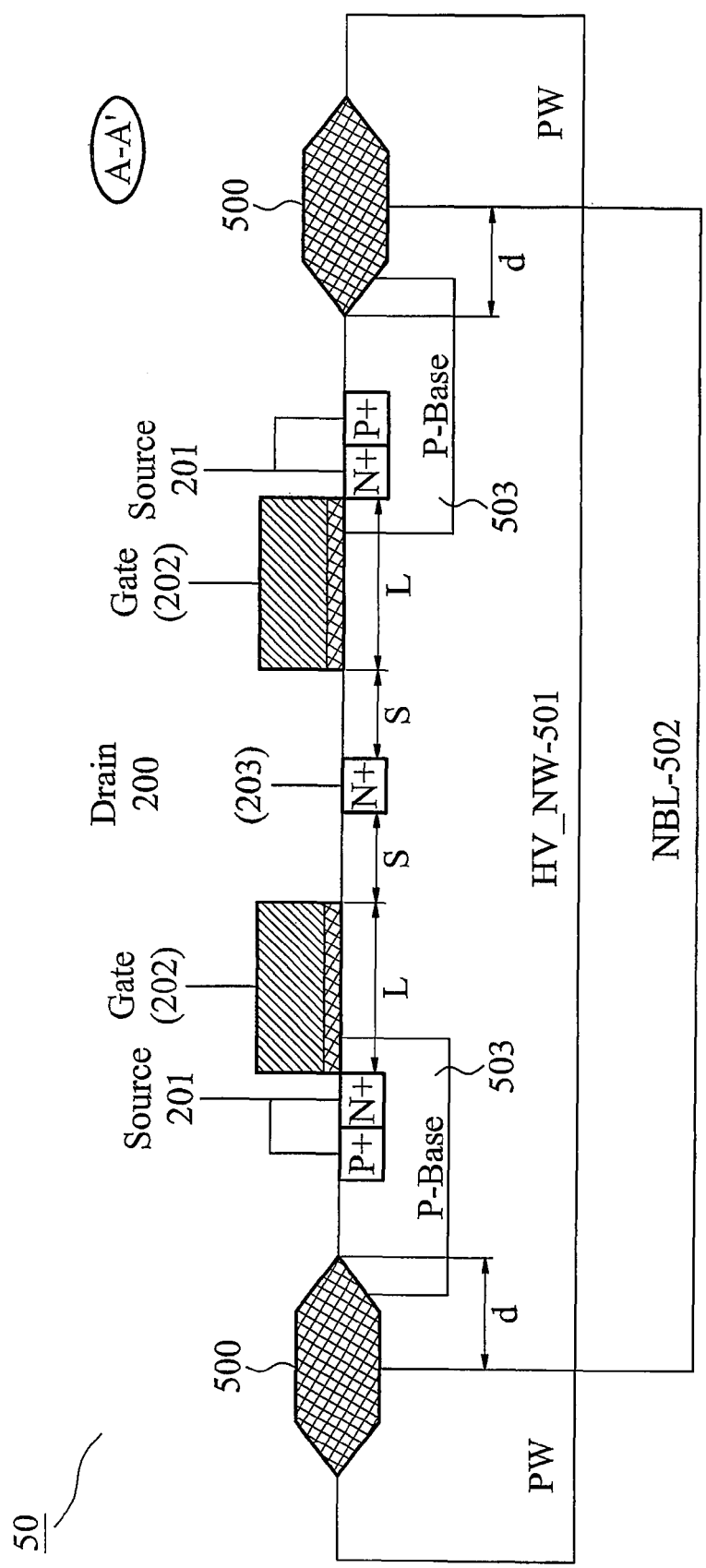
FIG. 5A is a cross-sectional view of a transistor group configured according to a first example embodiment of the present invention, wherein the cross-section corresponds to the line segment A-A' illustrated in FIG. 2.

FIG. 5A is a cross-sectional view of transistor group 50 configured according to a first example embodiment of the present invention, wherein the cross-section corresponds to the line segment A-A' illustrated in FIG. 2. In this first embodiment, the devices are isolated using field oxide 500. Also, buried layer 502 is generally used in isolation of complementary metal oxide semiconductor field effect transistors (CMOS) technology. The remaining embodiment includes high voltage substrate 501 with P-base regions 503 providing the active regions for source 201. In relation to the planar view illustrated in FIG. 2, transistor group 50 includes gates 202, N+ doped island 203, and drain 200, which is not shown on FIG. 5A, but is located in the middle of N+ doped island 203. As noted above, the barrier between the lighter doped substrate of high voltage substrate 501 and N+ doped island 203 provides a limiting effect on the amount and uniformity of current that passes through drain 200.

Figure 5B:
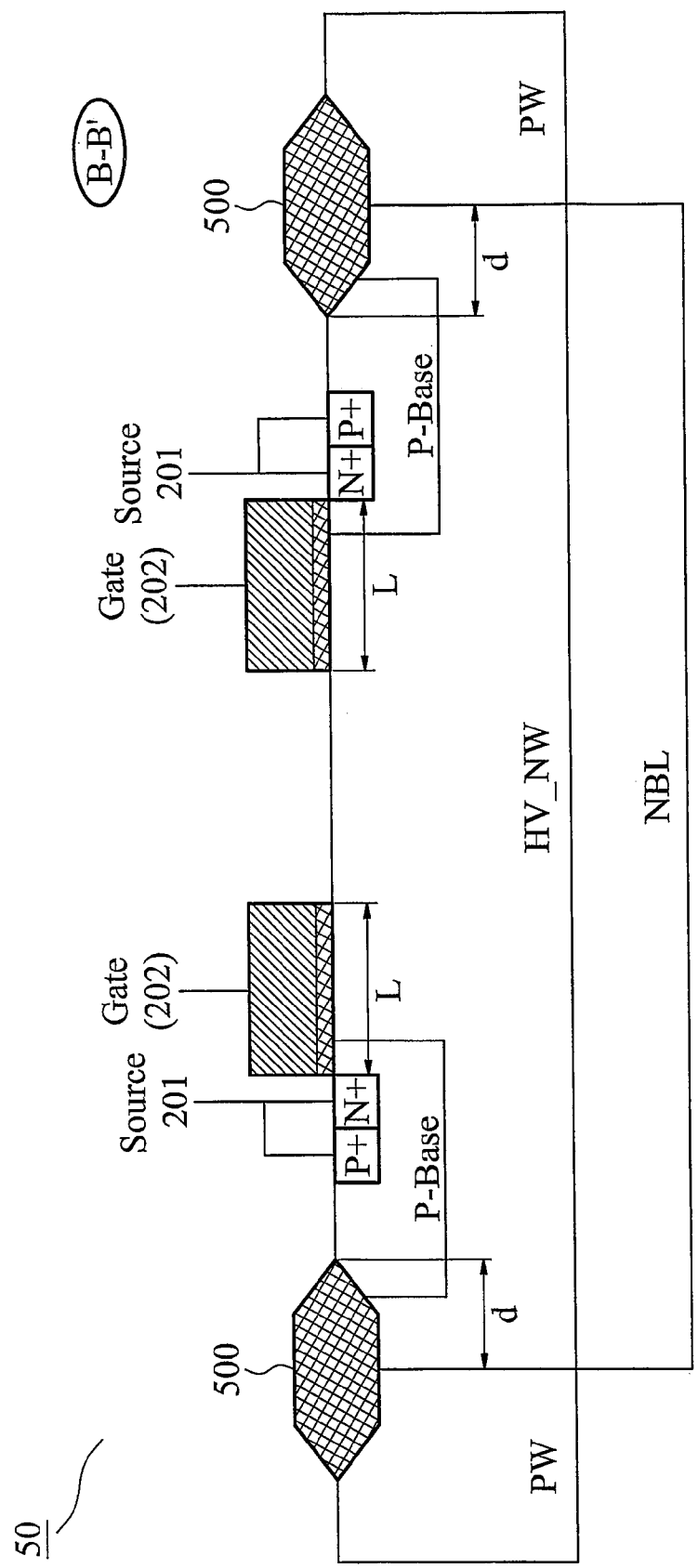
FIG. 5B is a cross-sectional view of a transistor group configured according to a first example embodiment of the present invention, wherein the cross-section corresponds to the line segment B-B' illustrated in FIG. 2.

FIG. 5B is a cross-sectional view of transistor group 50 configured according to a first example embodiment of the present invention, wherein the cross-section corresponds to the line segment B-B' illustrated in FIG. 2. FIG. 5B is instructional to illustrate the islands of N+ doped island 203 (FIG. 5A). Because the cross-section illustrated in FIG. 5B relates to the line segment B-B' of FIG. 2, there is no N+ doped island region shown. This is because N+ doped island 203 is not continuous.

Figure 6:
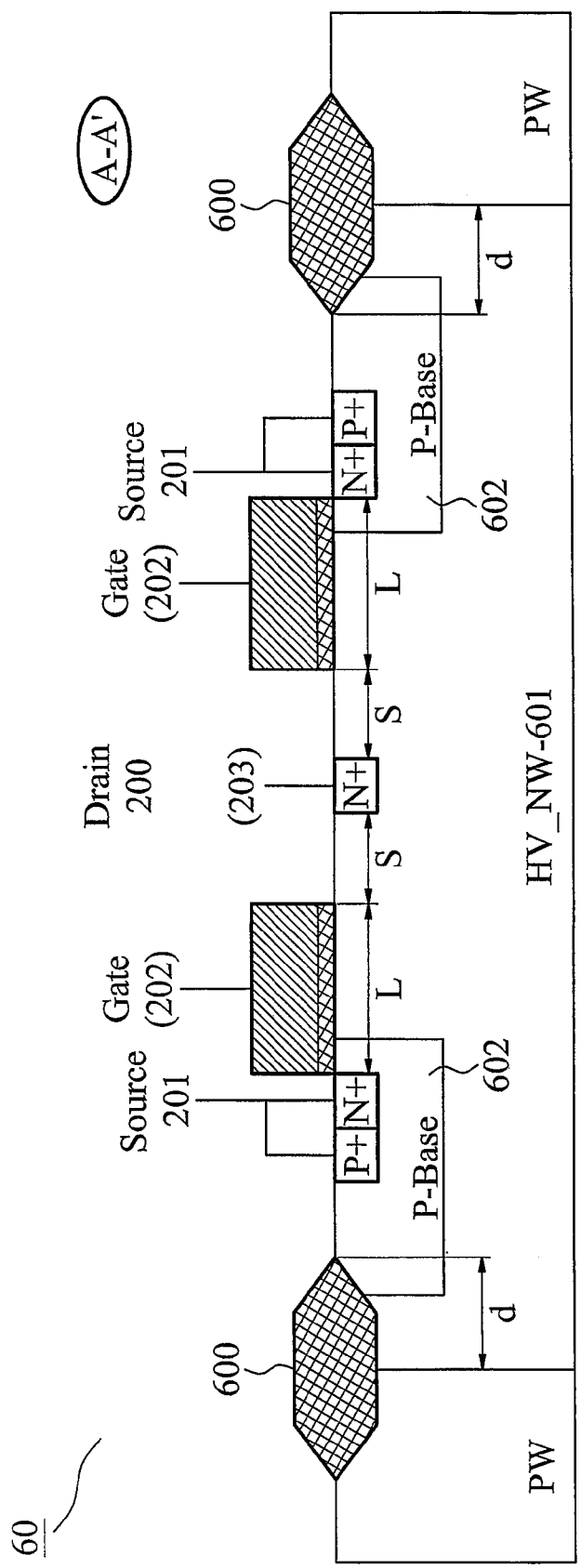
FIG. 6 is a cross-sectional view of a transistor group configured according to another example embodiment of the present invention, wherein the cross-section corresponds to the line segment A-A' illustrated in FIG. 2.

FIG. 6 is a cross-sectional view of transistor group 60 configured according to another example embodiment of the present invention, wherein the cross-section corresponds to the line segment A-A' illustrated in FIG. 2. In this additional embodiment illustrated in FIG. 6, the buried layer is not present as it was in the embodiment depicted in FIGS. 5A & B. Transistor group 60 includes field oxide implants or features 600 for isolating devices, high voltage substrate 601, and P-base regions 602 for source 201. It also shows gates 202 and N+ doped island 203 in which drain 200 would be located. The current is, thereby, limited by the junction between the different doped high-voltage substrate 601 and N+ doped island 203.

It should be noted that transistor group 60 would also have a cross-section view that did not show N+ doped island 203 at the B-B' line segment, such as depicted in FIG. 5B. However, for the purpose of conciseness, this view will not be illustrated for FIGS. 6-8.

Figure 7:
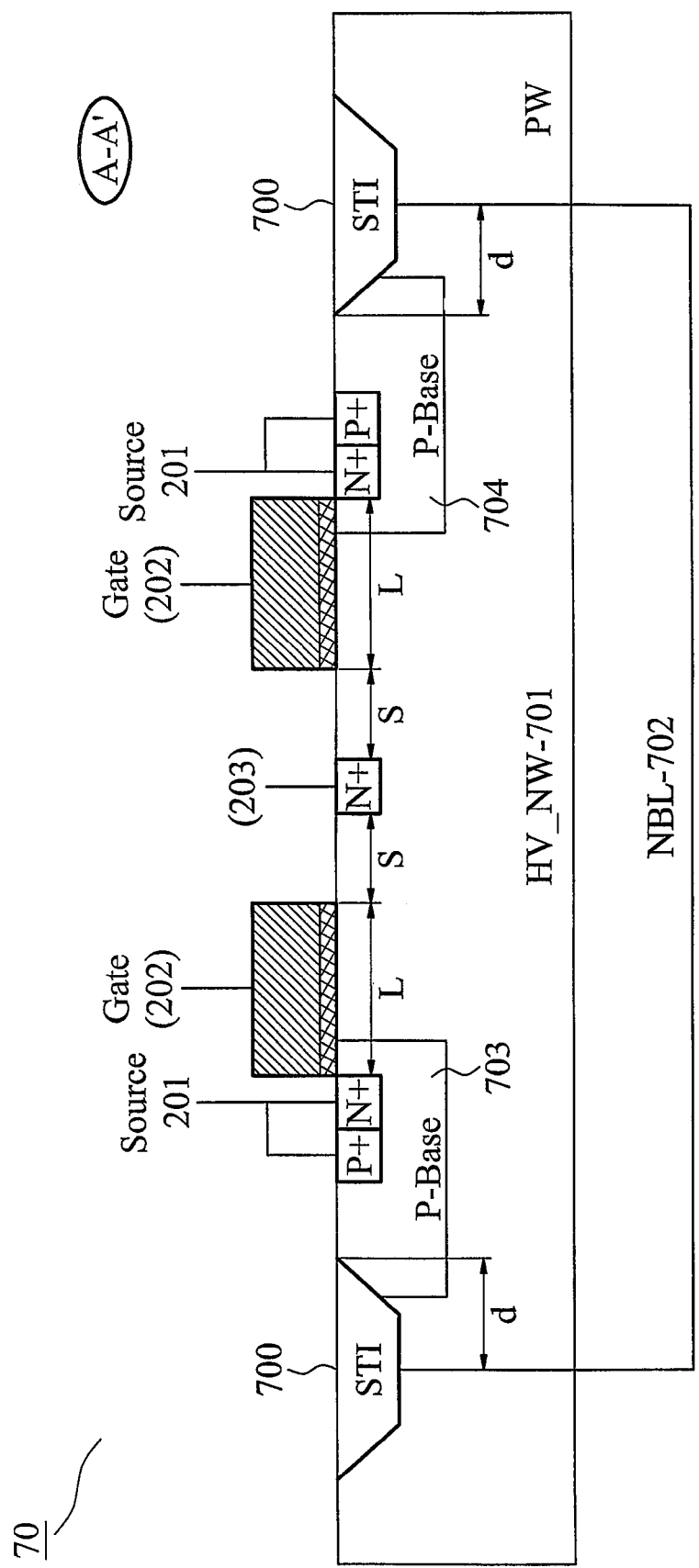
FIG. 7 is a cross-sectional view of a transistor group configured according to another example embodiment of the present invention, wherein the cross-section corresponds to the line segment A-A' illustrated in FIG. 2.

FIG. 7 is a cross-sectional view of transistor group 70 configured according to another example embodiment of the present invention, wherein the cross-section corresponds to the line segment A-A' illustrated in FIG. 2. In this embodiment, the devices are isolated using shallow trench isolation (STI) 700. STI are typically used in different size semiconductor technology than field oxide implants or features, as used in the previous figures. Transistor group 70 also includes buried layer 702, which is generally used in isolation of CMOS technology. The remaining embodiment includes high voltage substrate 701 with a P-base regions 703 providing the active regions for source 201. In relation to the planar view illustrated in FIG. 2, transistor group 70 includes gates 202, N+ doped island 203, and drain 200, which is not shown, but is located in the middle of N+ doped island 203. As noted above, the barrier between the lighter doped substrate of high voltage substrate 701 and N+ doped island 203 provides a limiting effect on the amount and uniformity of current that passes through drain 200.

Figure 8:
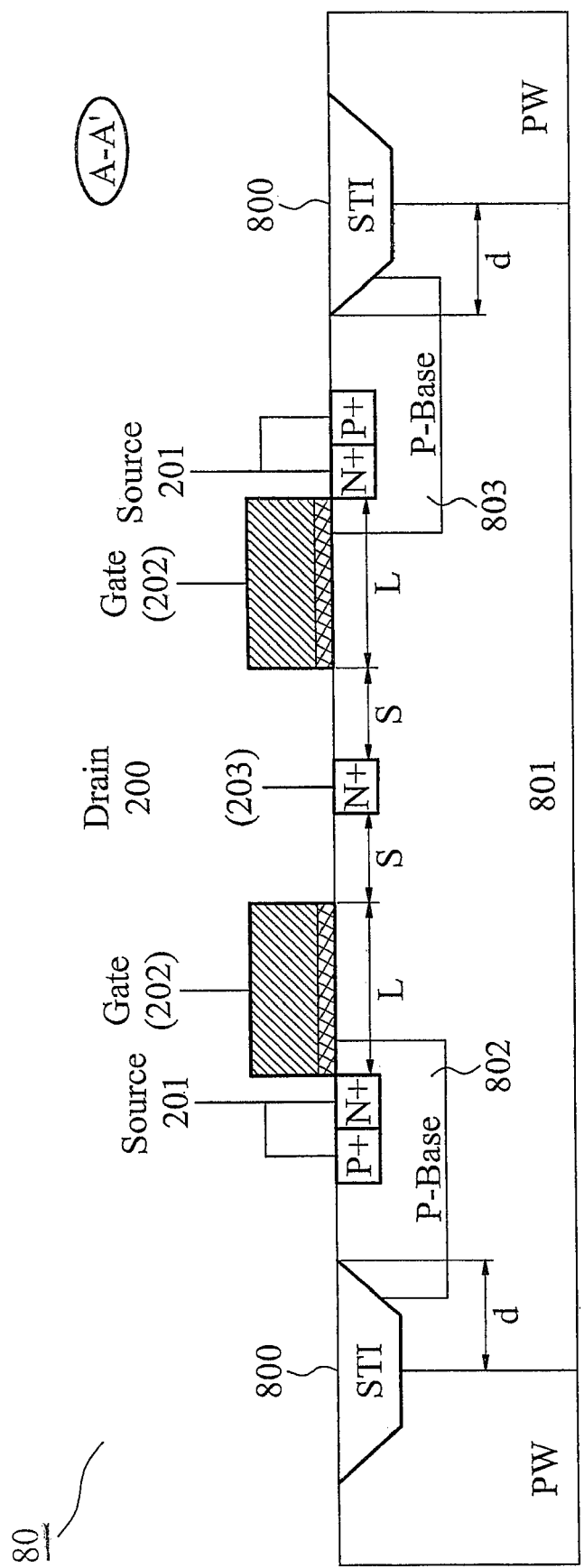
FIG. 8 is a cross-sectional view of a transistor group configured according to another example embodiment of the present invention, wherein the cross-section corresponds to the line segment A-A' illustrated in FIG. 2.

FIG. 8 is a cross-sectional view of a transistor group configured according to another example embodiment of the present invention, wherein the cross-section corresponds to the line segment A-A' illustrated in FIG. 2. In this additional embodiment illustrated in FIG. 8, the buried layer is not present as it was in the embodiment depicted in FIG. 7. Transistor group 80 includes STI 800 for isolating devices, substrate 801, and P-base regions 802 for source 201. It also shows gates 202 and N+ doped island 203 in which drain 200 would be located. The current is, thereby, limited by the junction between the different doped substrate 801 and N+ doped island 203.

Figure 9A:
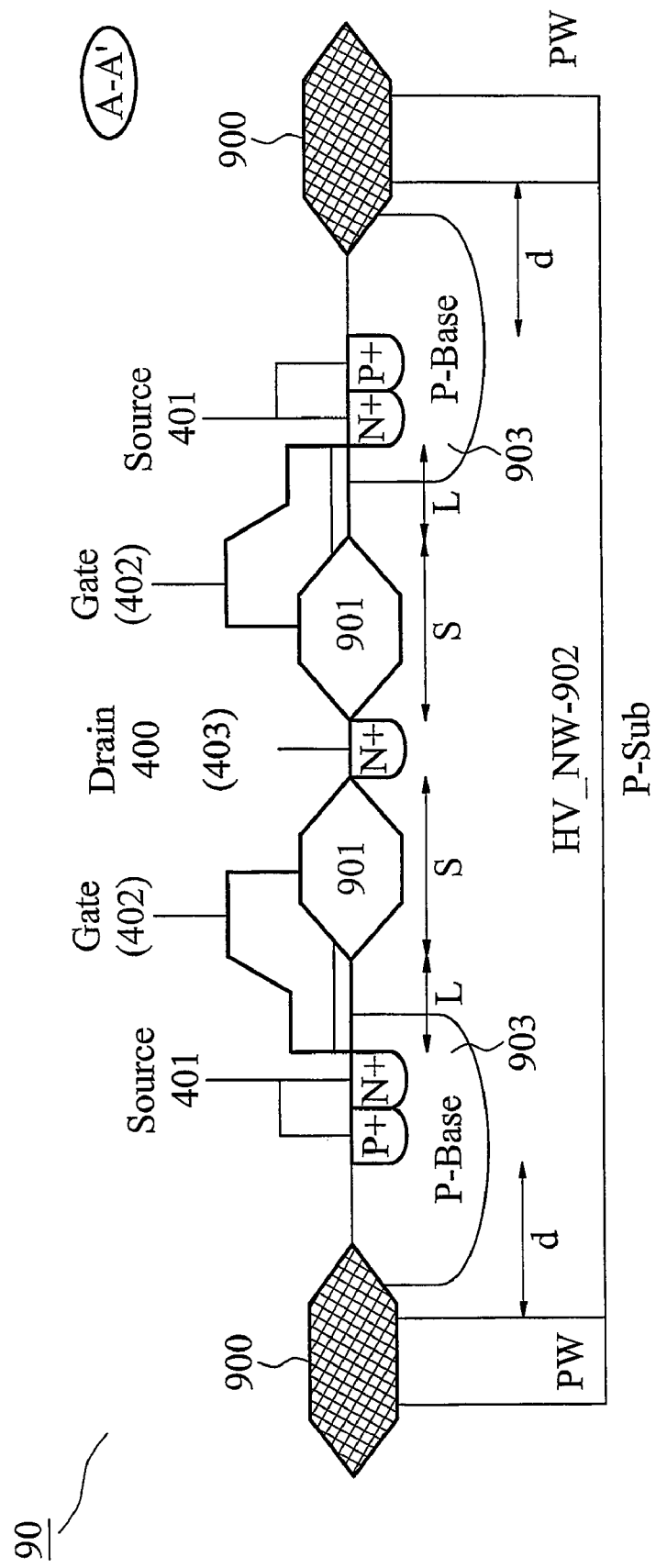
FIG. 9A is a cross-sectional view of a transistor group configured according to a first example embodiment of the present invention, wherein the cross-section corresponds to the line segment A-A' illustrated in FIG. 4.

FIG. 9A is a cross-sectional view of transistor group 90 configured according to a first example embodiment of the present invention, wherein the cross-section corresponds to the line segment A-A' illustrated in FIG. 4. In this embodiment, the devices are isolated using field oxide 900. The remaining embodiment includes high voltage substrate 902 with P− base regions 903 providing the active regions for sources 401. In relation to the planar view illustrated in FIG. 4, transistor group 90 includes poly gates 402, N+ doped islands 403, and drain 400, which is not shown, but is located in the middle of N+ doped island 403. In addition to these components, transistor group 90 includes free oxide 405, which not only creates N+ doped islands 403, but increases the isolating and current limiting effect of this configuration.

Figure 9B:
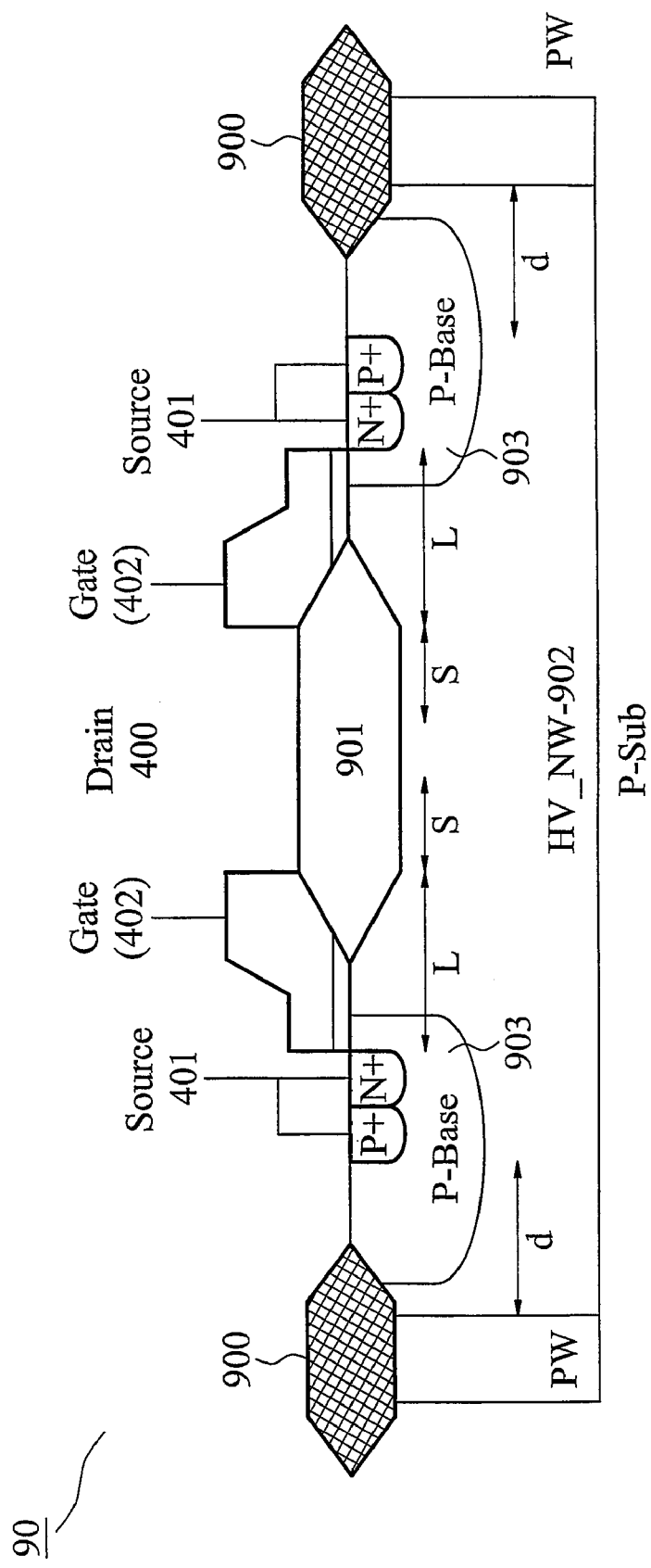
FIG. 9B is a cross-sectional view of a transistor group configured according to a first example embodiment of the present invention, wherein the cross-section corresponds to the line segment B-B' illustrated in FIG. 4.

FIG. 9B is a cross-sectional view of transistor group 90 configured according to a first example embodiment of the present invention, wherein the cross-section corresponds to the line segment B-B' illustrated in FIG. 4. FIG. 9B, as FIG. 5B, is instructional to illustrate N+ doped islands 403 (FIG. 9A). Because the cross-section illustrated in FIG. 9B relates to the line segment B-B' of FIG. 4, which cuts through the surround implants of free oxide 405.

Figure 10:
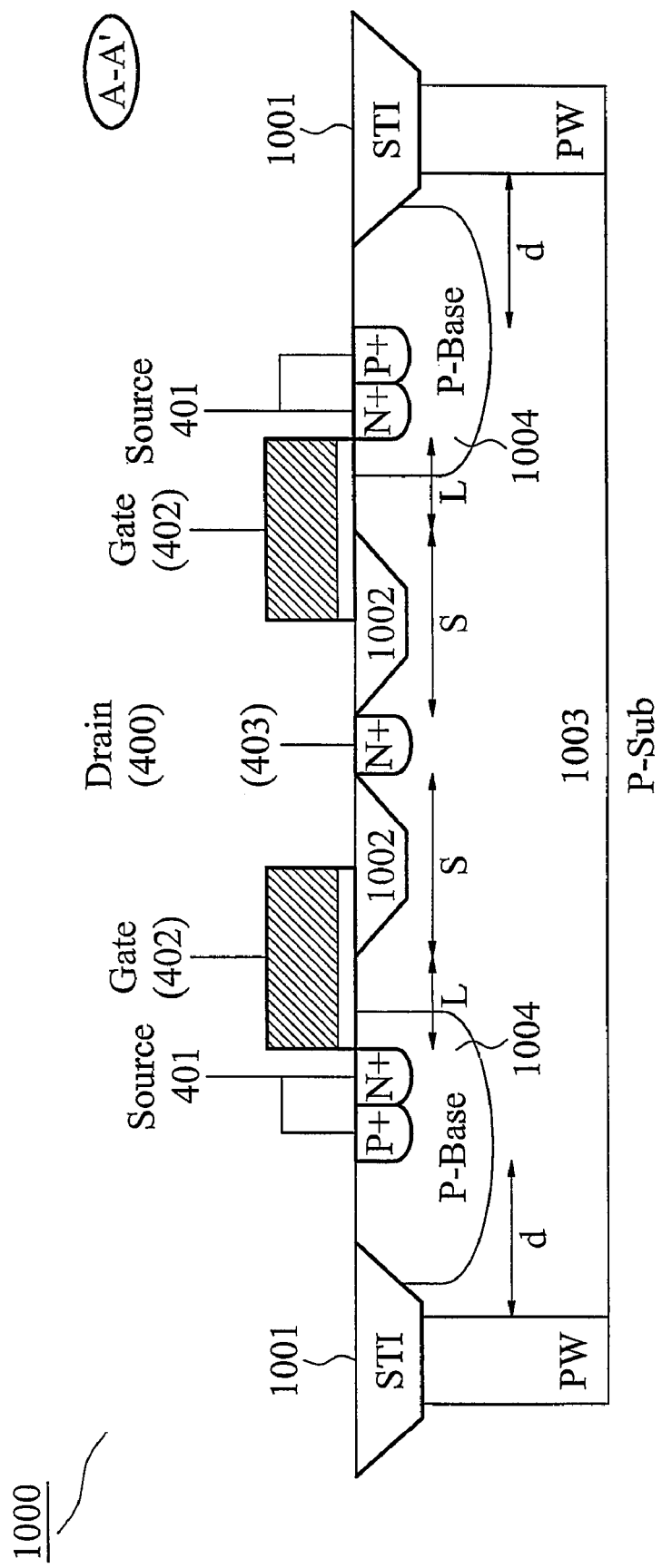
FIG. 10 is a cross-sectional view of a transistor group configured according to another example embodiment of the present invention, wherein the cross-section corresponds to the line segment A-A' illustrated in FIG. 4.

FIG. 10 is a cross-sectional view of transistor group 1000 configured according to another example embodiment of the present invention, wherein the cross-section corresponds to the line segment A-A' illustrated in FIG. 4. In this additional embodiment, transistor group 1000 includes STI 1001 for isolating devices, substrate 1003, and P-base regions 1004 for source 401. It also shows gates 402 and N+ doped island 403 in which drain 400 would be located. As in FIGS. 9A & B, N+ doped island 403 is formed by free oxide 1002. The current is, thereby, limited by the junction between substrate 1003 and free oxide 1002.

In processing the various embodiments of the present invention, during the standard processing of such transistor groups, instead of depositing a continuous N+ or P+ doped region around each of the drains of the transistors, an island of such N+ or P+ doping is created. Therefore, each drain of the multiple transistors formed within the transistor group will have an isolated island of N+ or P+ doping surrounding it. This may be accomplished by doping the P or N material as an island within the surrounding substrate or by surrounding the doped region with some kind of insulator or oxide, such as a free oxide. The resultant isolation of the drain regions controls or limits the amount of current that can pass through it, thereby, creating a more uniform current through the transistors. This assists in preventing damage to the transistors caused by an ESD event.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a plurality of transistors on a substrate, said plurality of transistors comprising:
a common gate region, said common gate region providing a gate terminal and contact for each of said plurality of transistors;
a plurality of source terminals associated with said common gate region, said plurality of source terminals each having a source contact and providing an individual source terminal for each of said plurality of transistors; and
a plurality of drain terminals associated with said common gate region, said plurality of drain terminals each having a drain contact and a doped region within the substrate, wherein each of said plurality of drain terminals corresponds to a corresponding one of said plurality of source terminals; and
a plurality of isolation regions surrounding each of said plurality of drain terminals.

2. The semiconductor device of claim 1 wherein each of said plurality of drain terminals comprises an N+ doped region and wherein each of said plurality of isolation regions comprises a lightly N-doped region making up said substrate.

3. The semiconductor device of claim 1 wherein each of said plurality of drain terminals comprises an N+ doped region and wherein each of said plurality of isolation regions comprises an oxide layer located partially beneath a surface of said substrate and partially above said surface.

4. The semiconductor device of claim 1 wherein said plurality of drain terminals comprises a P+ doped region and wherein said plurality of isolation regions comprises a lightly P-doped region making up said substrate.

5. The semiconductor device of claim 1 wherein each of said plurality of drain terminals comprises a P+ doped region and wherein each of said plurality of isolation regions comprises an oxide layer located partially beneath a surface of said substrate and partially above said surface.

6. The semiconductor device of claim 1 wherein said substrate comprises a high voltage substrate.

7. The semiconductor device of claim 6 wherein said high voltage substrate includes a buried layer.

8. The semiconductor device of claim 1 wherein said semiconductor device is isolated from one or more additional semiconductor devices on said substrate by one of:
one or more shallow trench isolation (STI) features; and
one or more field oxide features.

9. The semiconductor device of claim 1 wherein said gate region comprises polysilicon.

10. A semiconductor component comprising:
a plurality of semiconductor devices on a substrate, wherein each of said plurality of semiconductor devices comprises:
a plurality of transistors, said plurality of transistors comprising:
at least one common gate region across a portion of said substrate, said at least one common gate region having a gate electrical contact;
a plurality of first S/D terminals associated with said at least one common gate region, each of said plurality of first S/D terminals having a first terminal electrical contact;
a plurality of second S/D terminals associated with corresponding ones of said plurality of first S/D terminals, each of said plurality of second S/D terminals having a second terminal electrical contact and a doped region within the substrate, wherein said plurality of second S/D terminals, said corresponding ones of said plurality of first S/D terminals, and said at least one common gate region make up said plurality of transistors; and
a plurality of terminal isolation regions located around each of said plurality of second S/D terminals; and
a plurality of device isolation regions located around each of said plurality of semiconductor devices on said substrate.

11. The semiconductor component of claim 10 wherein said plurality of second S/D terminals comprises an N+ doped region in said substrate and wherein said plurality of terminal isolation regions comprises a lightly-doped N material making up said substrate and disposed between each of said plurality of second S/D terminals.

12. The semiconductor component of claim 10 wherein said plurality of terminal isolation regions comprises a plurality of oxide layers located partially below a surface of said substrate and partial above said surface.

13. The semiconductor component of claim 10 wherein said common gate region comprises polysilicon.

14. The semiconductor component of claim 10 wherein said substrate comprises a high voltage substrate.

15. The semiconductor component of claim 14 wherein said high voltage substrate includes a buried layer.

* * * * *